(12) United States Patent
Yu et al.

(10) Patent No.: US 10,157,784 B2
(45) Date of Patent: Dec. 18, 2018

(54) INTEGRATION OF A SELF-FORMING BARRIER LAYER AND A RUTHENIUM METAL LINER IN COPPER METALLIZATION

(71) Applicant: Tokyo Electron Limited, Minato-ku, Tokyo (JP)

(72) Inventors: Kai-Hung Yu, Watervliet, NY (US); Manabu Oie, Watervliet, NY (US); Kaoru Maekawa, Albany, NY (US); Cory Wajda, Sand Lake, NY (US); Gerrit J. Leusink, Rexford, NY (US); Yuuki Kikuchi, Nirasaki (JP); Hiroaki Kawasaki, Nirasaki (JP); Hiroyuki Nagai, Kai (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 15/428,749

(22) Filed: Feb. 9, 2017

(65) Prior Publication Data
US 2017/0236752 A1 Aug. 17, 2017

Related U.S. Application Data

(60) Provisional application No. 62/294,985, filed on Feb. 12, 2016.

(51) Int. Cl.
*H01L 21/285* (2006.01)
*H01L 21/768* (2006.01)
(Continued)

(52) U.S. Cl.
CPC .... *H01L 21/76846* (2013.01); *H01L 21/2855* (2013.01); *H01L 21/76856* (2013.01);
(Continued)

(58) Field of Classification Search
None
See application file for complete search history.

(56) References Cited

U.S. PATENT DOCUMENTS 6,432,820 B1 8/2002 Lee
8,653,665 B2 2/2014 Miyoshi
(Continued)

FOREIGN PATENT DOCUMENTS

JP 2015-012132 A 1/2015
JP 2015-220315 A 12/2015

OTHER PUBLICATIONS

Japan Patent Office, first Official Action for Japanese Patent Application No. 2017-023136, dated Oct. 17, 2017, 6 pages.
(Continued)

*Primary Examiner* — Erik T Peterson

(57) ABSTRACT

Methods for integration of conformal barrier layers and Ru metal liners with Cu metallization in semiconductor manufacturing are described in several embodiments. According to one embodiment, the method includes providing a substrate containing a recessed feature, depositing a barrier layer in the recessed feature, depositing a Ru metal liner on the barrier layer, and exposing the substrate to an oxidation source gas to oxidize the barrier layer through the Ru metal liner. The method further includes filling the recessed feature with CuMn metal using an ionized physical vapor deposition (IPVD) process, heat-treating the substrate to diffuse Mn from the CuMn metal to the oxidized barrier layer, and reacting the diffused Mn with the oxidized barrier layer to form a Mn-containing diffusion barrier.

18 Claims, 10 Drawing Sheets

(51) Int. Cl.
*H01L 23/528* (2006.01)
*H01L 23/532* (2006.01)

(52) U.S. Cl.
CPC .. *H01L 21/76858* (2013.01); *H01L 21/76864* (2013.01); *H01L 21/76877* (2013.01); *H01L 21/76883* (2013.01); *H01L 23/5283* (2013.01); *H01L 23/53238* (2013.01); *H01L 21/76879* (2013.01)

(56) References Cited

U.S. PATENT DOCUMENTS

| | | | |
|---|---|---|---|
| 9,101,067 B2 | 8/2015 | Ishizaka et al. | |
| 2002/0036309 A1* | 3/2002 | Sekiguchi | H01L 21/76843 257/301 |
| 2007/0072415 A1* | 3/2007 | Suzuki | C23C 16/18 438/652 |
| 2008/0237029 A1* | 10/2008 | Tang | C23C 14/0036 204/164 |
| 2008/0242088 A1* | 10/2008 | Suzuki | H01L 21/76843 438/687 |
| 2009/0087981 A1* | 4/2009 | Suzuki | H01L 21/28518 438/643 |
| 2009/0130843 A1* | 5/2009 | Suzuki | H01L 21/28556 438/653 |
| 2009/0202710 A1 | 8/2009 | Marcadal et al. | |
| 2011/0266676 A1* | 11/2011 | Isobayashi | H01L 21/76831 257/751 |
| 2014/0030886 A1 | 1/2014 | Fukushima et al. | |
| 2014/0045329 A1* | 2/2014 | Ishizaka | H01L 21/2855 438/643 |
| 2014/0161992 A1 | 6/2014 | Ishizaka et al. | |
| 2014/0287163 A1 | 9/2014 | Ishizaka et al. | |
| 2015/0004784 A1* | 1/2015 | Yokoyama | H01L 21/76877 438/653 |
| 2015/0221550 A1 | 8/2015 | Yu et al. | |
| 2015/0340323 A1 | 11/2015 | Cabral, Jr. et al. | |
| 2016/0056076 A1* | 2/2016 | Edelstein | H01L 21/76879 438/627 |

OTHER PUBLICATIONS

Takeshi Nogami et al., "Through-Cobalt Self Forming Barrier (tCoSFB) for Cu/ULK BEOL: A Novel Concept of Advanced Technology Nodes", Electron Devices Meeting (IEDM), 2015 IEEE International, Washington, DC, USA, Dec. 7-9, 2015, 4 pages.

* cited by examiner

INTEGRATION OF A SELF-FORMING BARRIER LAYER AND A RUTHENIUM METAL LINER IN COPPER METALLIZATION

CROSS-REFERENCE TO RELATED APPLICATIONS

This application is related to and claims priority to U.S. provisional application Ser. No. 62/294,985 filed on Feb. 12, 2016, the entire contents of which are herein incorporated by reference.

FIELD OF THE INVENTION

The present invention generally relates to integrating a conformal barrier layer and a ruthenium (Ru) metal liner with copper (Cu) metallization in semiconductor manufacturing.

BACKGROUND OF THE INVENTION

Back-end-of-line (BEOL) performance/area/cost scaling are the foremost issues for 10 nm/7 nm technology nodes. Metal lines and vias will continue to be the key areas for yield improvement, making line/via resistance as well as Cu fill the key technical challenges at 10 nm node and beyond.

Physical vapor deposition (PVD) of TaN has reached its limits to meet process requirements for precise thickness and composition control, conformality, uniformity as well as interlayer dielectric damage. Atomic layer deposition (ALD) of barrier layers show promise due to the nearly 100% conformality even in high aspect ratio structures, hence reducing "pinch off" and Cu void formation, without damaging the dielectric. However, ALD barriers have so far not delivered on their promise as PVD Ta flash deposition and/or PVD Cu seed layers were still needed to provide a good barrier-Cu interface.

SUMMARY OF THE INVENTION

Methods for integration of conformal barrier layers and Ru metal liners with Cu metallization in semiconductor manufacturing are described in several embodiments. According to one embodiment, the method includes providing a substrate containing a recessed feature, depositing a barrier layer in the recessed feature, depositing a Ru metal liner on the barrier layer, and exposing the substrate to an oxidation source gas to oxidize the barrier layer through the Ru metal liner. The method further includes filling the recessed feature with CuMn metal using an ionized physical vapor deposition (IPVD) process, heat-treating the substrate to diffuse Mn from the CuMn metal to the oxidized barrier layer, and reacting the diffused Mn with the oxidized barrier layer to form a Mn-containing diffusion barrier.

DETAILED DESCRIPTION OF SEVERAL EMBODIMENTS

Methods for integration of conformal barrier layers and Ru metal liners with Cu metallization in semiconductor manufacturing are described in several embodiments.

According to one embodiment, a method is provided for forming a semiconductor device, where the method includes providing a substrate containing a recessed feature, depositing a barrier layer in the recessed feature, depositing a Ru metal liner on the barrier layer, and exposing the recessed feature to an oxidation source gas to oxidize the barrier layer. The method further includes filling the recessed feature with CuMn metal using an IPVD process, heat-treating the substrate to diffuse Mn from the CuMn metal to the oxidized barrier layer, and reacting the diffused Mn with the oxidized barrier layer to form a Mn-containing diffusion barrier.

Figure 1:
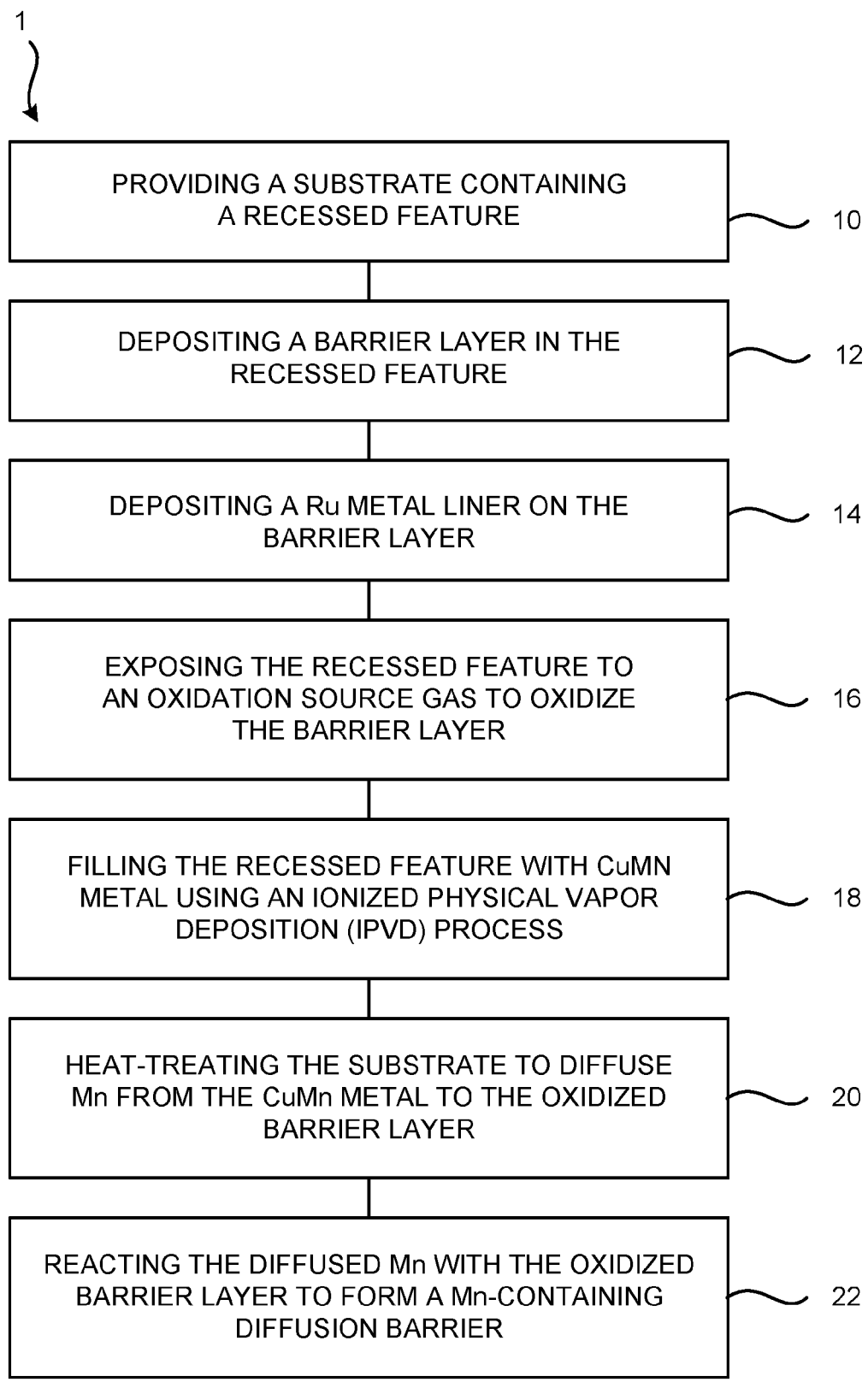
FIG. 1 is a process flow diagram for processing a substrate according to an embodiment of the invention.

FIG. 1 is a process flow diagram for processing a substrate according to an embodiment of the invention, and FIGS. 2A-2I schematically show through cross-sectional views a method of processing a substrate according to an embodiment of the invention.

Figure 2A:
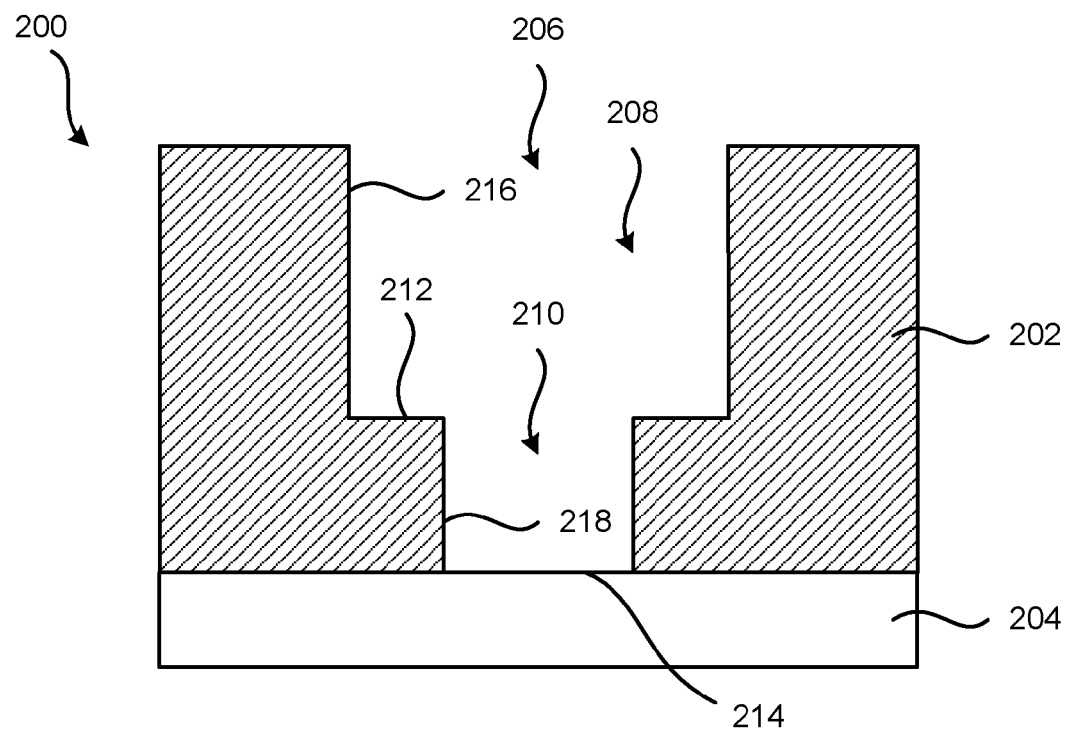
FIGS. 2A-2I schematically show through cross-sectional views a method of processing a substrate according to an embodiment of the invention.

The process flow 1 includes, in 10, providing a substrate 200 containing a recessed feature 206 (FIG. 2A). The exemplary recessed feature 206 contains a trench 208 having a sidewall 216 and a bottom portion 212, and a via 210 having a sidewall 218 and a bottom portion 214. The recessed feature 206 is formed in a first layer 202 and the bottom portion 214 includes a top surface of an underlying second layer 204. However, as those skilled in the art will readily appreciate, embodiments of the invention may also readily be applied to other simpler or more complicated recessed features found in semiconductor device manufacturing. In one example, the first layer 202 may contain a dielectric material (e.g., a high-k material or a low-k material), and the second layer 204 may contain a metal layer (e.g., Cu).

Figure 2B:
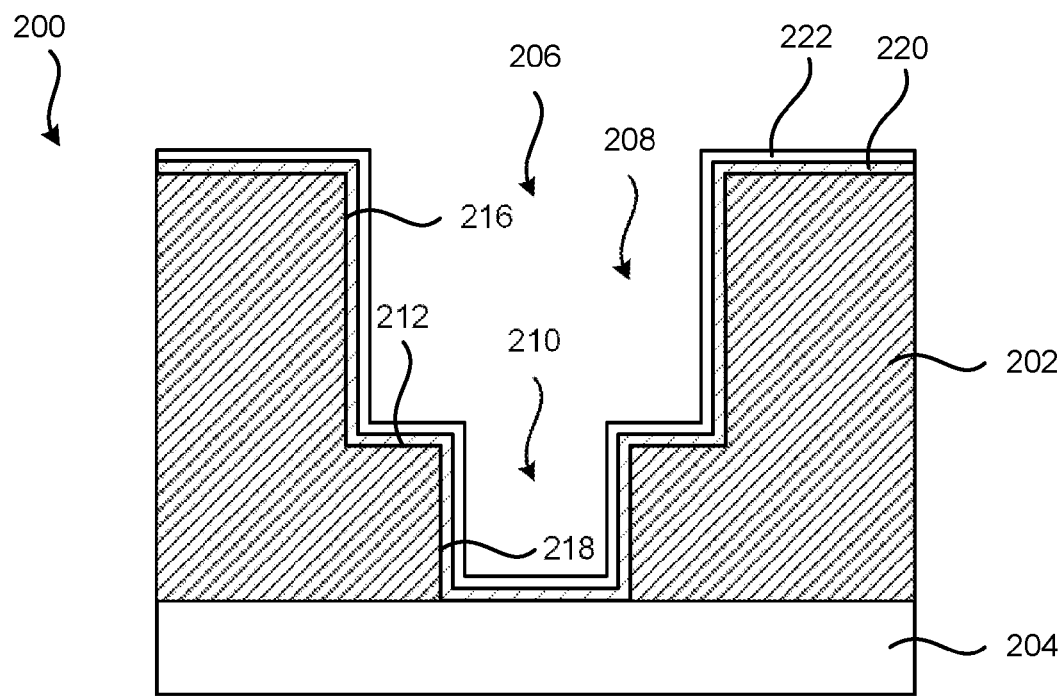

The method further includes, in 12, depositing a barrier layer 220 in the recessed feature 206 and, in 14, depositing a Ru metal liner 222 on the barrier layer 220 (FIG. 2B). According to one embodiment, the barrier layer 220 may contain TaN or TaAlN that is deposited by ALD. An exemplary thickness of the barrier layer 220 can be between about 0.5 nm and about 3 nm, between about 1 nm and about 2 nm, about 2 nm, about 1 nm, less than 2 nm, or less than 1 nm. A TaN barrier layer may be crystalline, but the addition of Al can form an amorphous TaAlN barrier layer.

ALD of a TaN barrier layer may include, sequentially first, exposing the substrate to a tantalum precursor, for example (tBuN)Ta(NEtMe)$_3$ (TBTEMT), and second, exposing the substrate to a nitrogen precursor, for example NH$_3$. Thereafter, the exposing steps may be repeated one or more times until the ALD TaN barrier layer has a desired thickness.

According to embodiments of the invention, the tantalum precursor may selected from the group consisting of Ta(NMe$_2$)$_3$(NCMe$_2$Et) (TAIMATA), Ta(NEt$_2$)$_5$ (PDEAT), Ta(NMe$_2$)$_5$ (PDMAT), Ta(NEtMe)$_5$ (PEMAT), (tBuN)Ta(NMe$_2$)$_3$ (TBTDMT), (tBuN)Ta(NEt$_2$)$_3$ (TBTDET), (tBuN)Ta(NEtMe)$_3$ (TBTEMT), and (iPrN)Ta(NEt$_2$)$_3$ (IPTDET).

ALD of a TaAlN barrier layer can include, sequentially first, exposing the substrate to a tantalum precursor, for example TBTEMT, and second, exposing the substrate to a nitrogen precursor, for example NH$_3$. Those exposing steps may be repeated one or more times. Thereafter, the ALD can further include, sequentially first, exposing the substrate to an aluminum precursor, and second, exposing the substrate to the nitrogen precursor. Thereafter, the exposing steps may be repeated until the TaAlN barrier layer has a desired thickness. The Ta:Al cycle ratio may be used to control the relative amounts of Ta and Al in the TaAlN barrier layer. In some examples, the TaAlN barrier layers may contain between about 5 and 25 atomic % Al.

According to embodiments of the invention, the aluminum precursor may be selected from the group consisting of AlMe$_3$, AlEt$_3$, AlMe$_2$H, [Al(OsBu)$_3$]$_4$, Al(CH$_3$COCHCOCH$_3$)$_3$, AlCl$_3$, AlBr$_3$, AlI$_3$, Al(OiPr)$_3$, [Al(NMe$_2$)$_3$]$_2$, Al(iBu)$_2$Cl, Al(iBu)$_3$, Al(iBu)$_2$H, AlEt$_2$Cl, Et$_3$Al$_2$(OsBu)$_3$, Al(THD)$_3$, H$_3$AlNMe$_3$, H$_3$AlNEt$_3$, H$_3$AlNMe$_2$Et, and H$_3$AlMeEt$_2$.

The Ru metal liner 222 may, for example, be deposited by chemical vapor deposition (CVD) using a Ru$_3$(CO)$_{12}$ precursor and CO as a carrier gas. An exemplary thickness of the Ru metal liner 222 can between about 0.3 nm and about 2 nm.

Figure 2C:
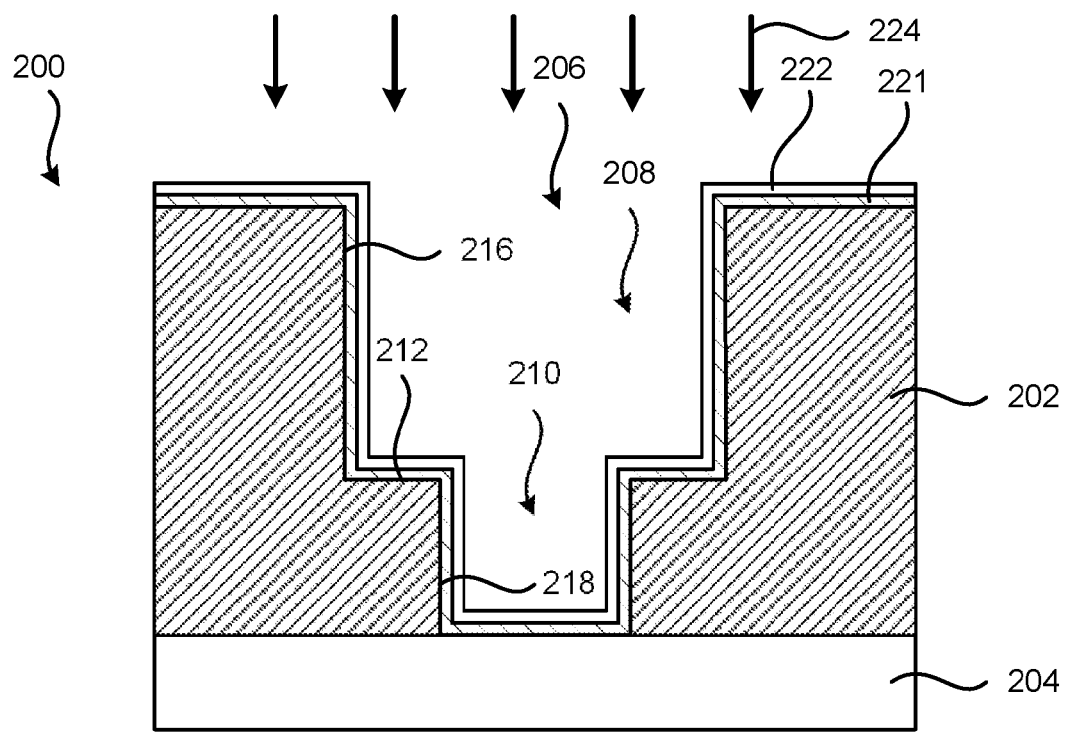

The method further includes, in 16, exposing the substrate 200 to an oxidation source gas 224 to oxidize the barrier layer 220 through the Ru metal liner 222 and form an oxidized barrier layer 221 (FIG. 2C). The oxidation of the barrier layer 220 is facilitated by the very low thickness of the Ru metal liner 222. According to some embodiments, the oxidation source gas 224 can include oxygen (O$_2$), water (H$_2$O), or a combination thereof. In one example, the oxidation source gas 224 can include an air exposure. An air exposure may last between a few seconds and a couple days and can cause at least partial oxidation of the barrier layer 220 through the Ru metal liner 222.

Figure 2D:
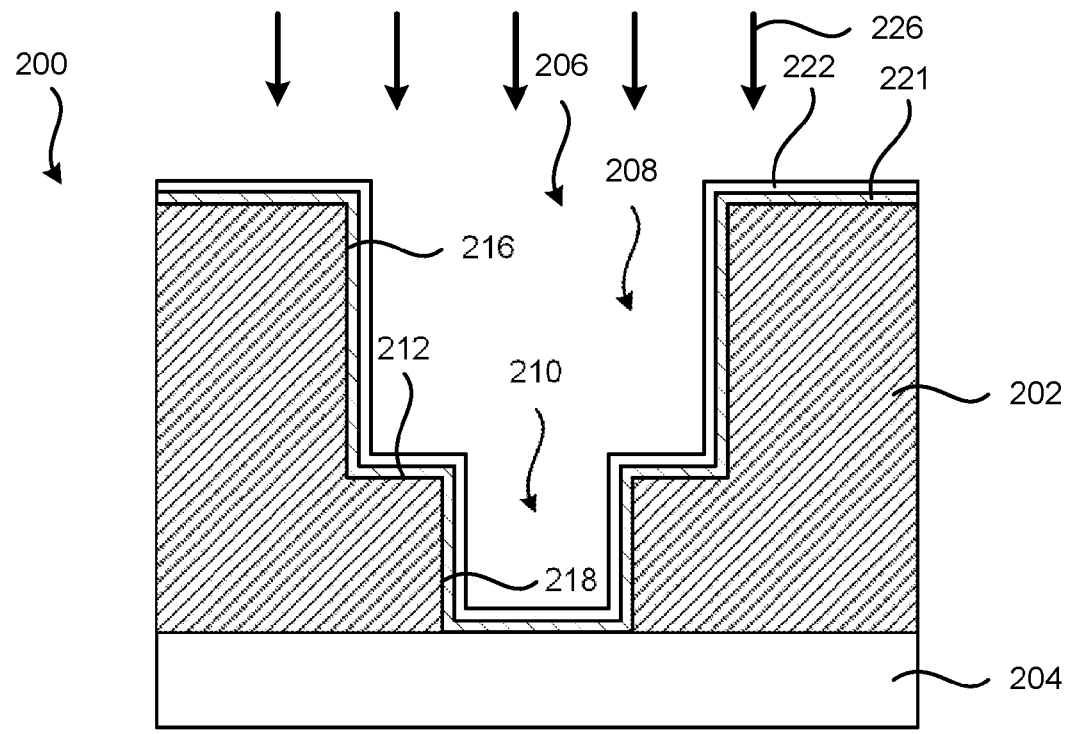

According to one embodiment, following the exposure to the oxidation source gas, the substrate 200 may be treated to remove excess moisture and other impurities from the recessed feature 206. The substrate 200 may be treated by degassing and exposure to a reducing atmosphere 226 (FIG. 2D). The degassing can include heating the substrate 200 in the presence of argon (Ar) under reduced pressure (e.g., 10 Torr) and a substrate temperature of about 350° C., and the reducing atmosphere can include a hydrogen (H$_2$) plasma at a substrate temperature of about 350° C.

Figure 2E:
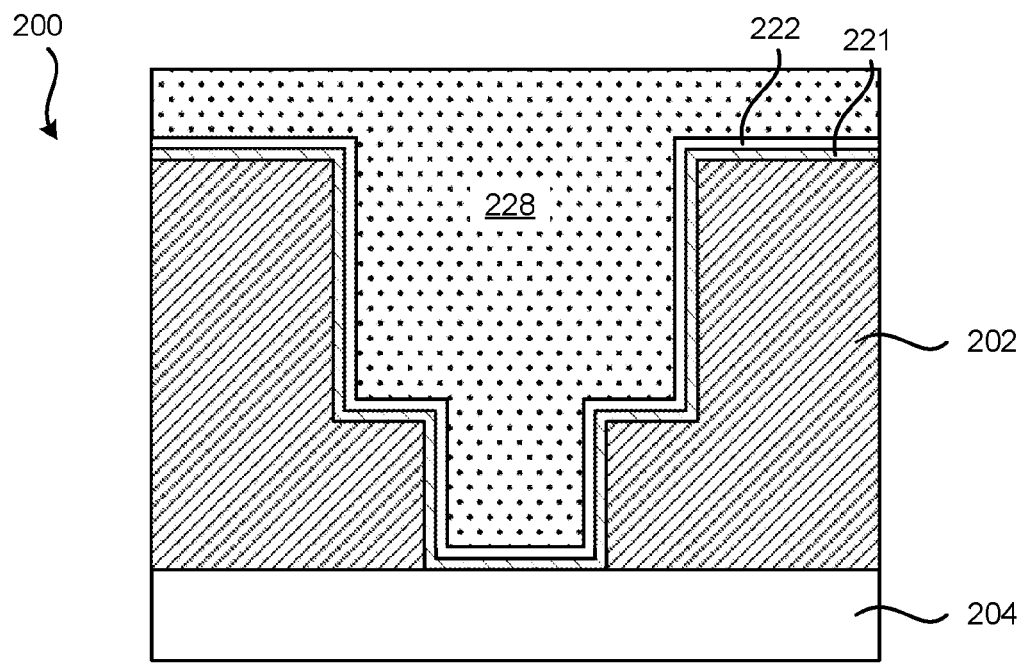
Figure 2F:
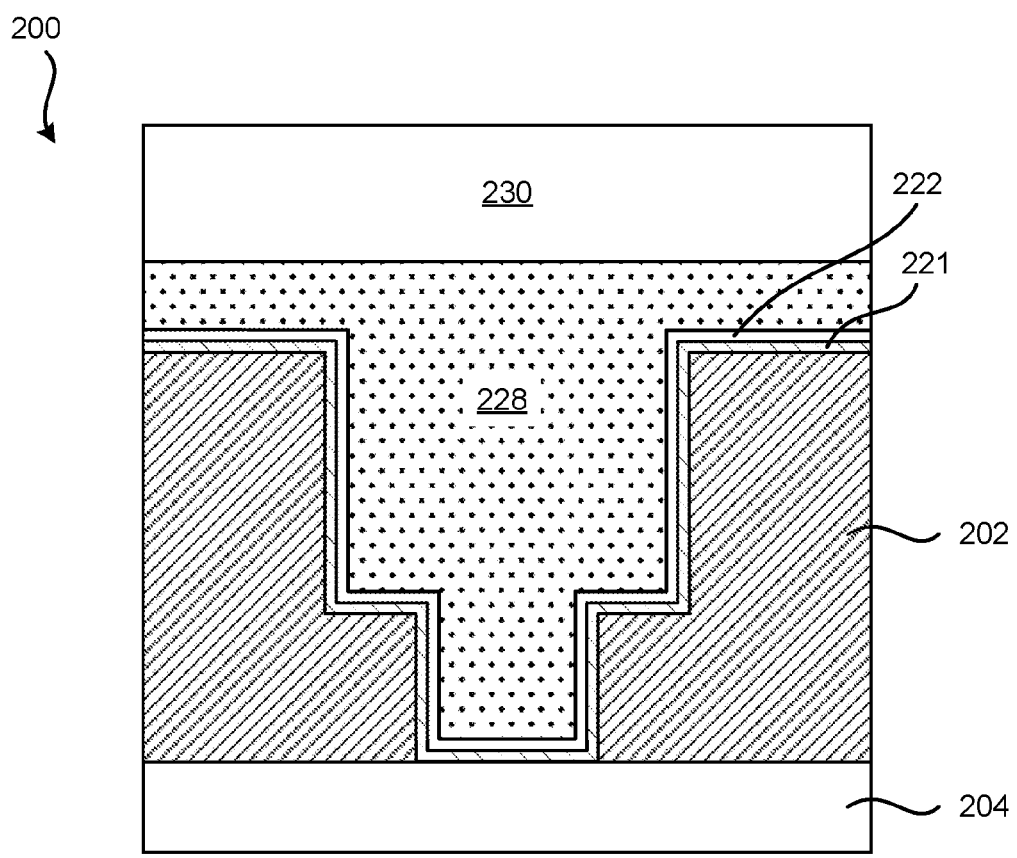

The method further includes, in 18, filling the recessed feature 206 with CuMn metal 228 using an ionized physical vapor deposition (IPVD) process (FIG. 2E). The IPVD process may utilize a CuMn sputtering target as a source of the Cu and Mn metals. In one example, the CuMn sputtering target can contain between about 1and about 20 atomic % Mn, and balance Cu. An exemplary IPVD process is described in U.S. Pat. No. 7,618,888, the entire contents of which are herein incorporated by reference.

Figure 2G:
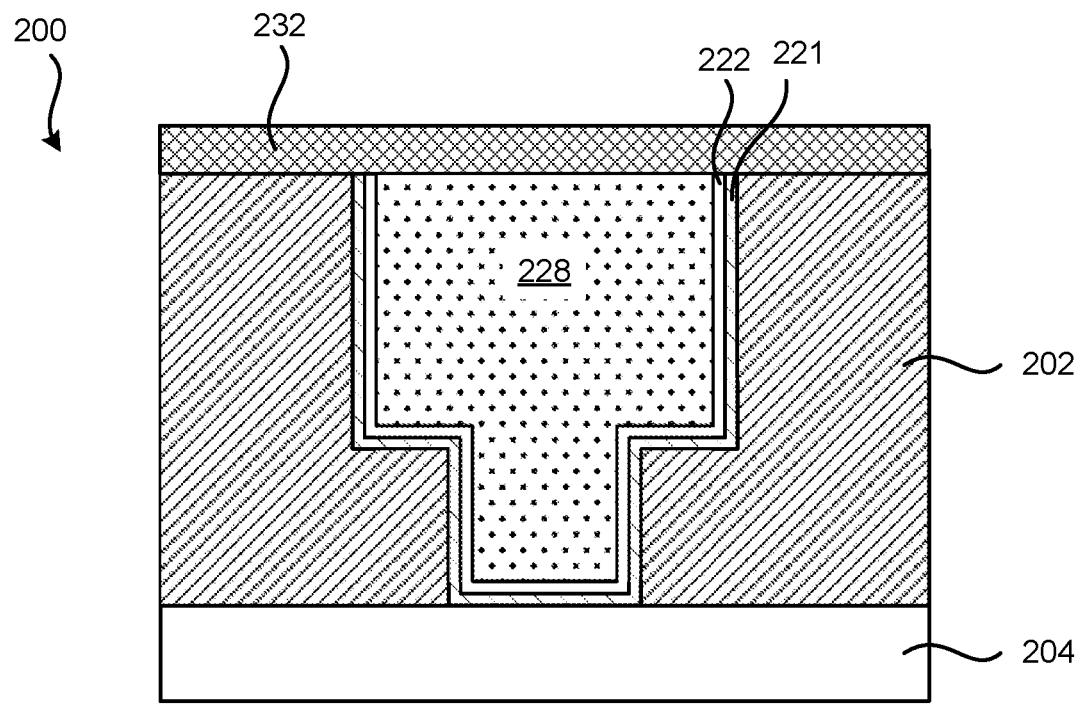
Figure 2H:
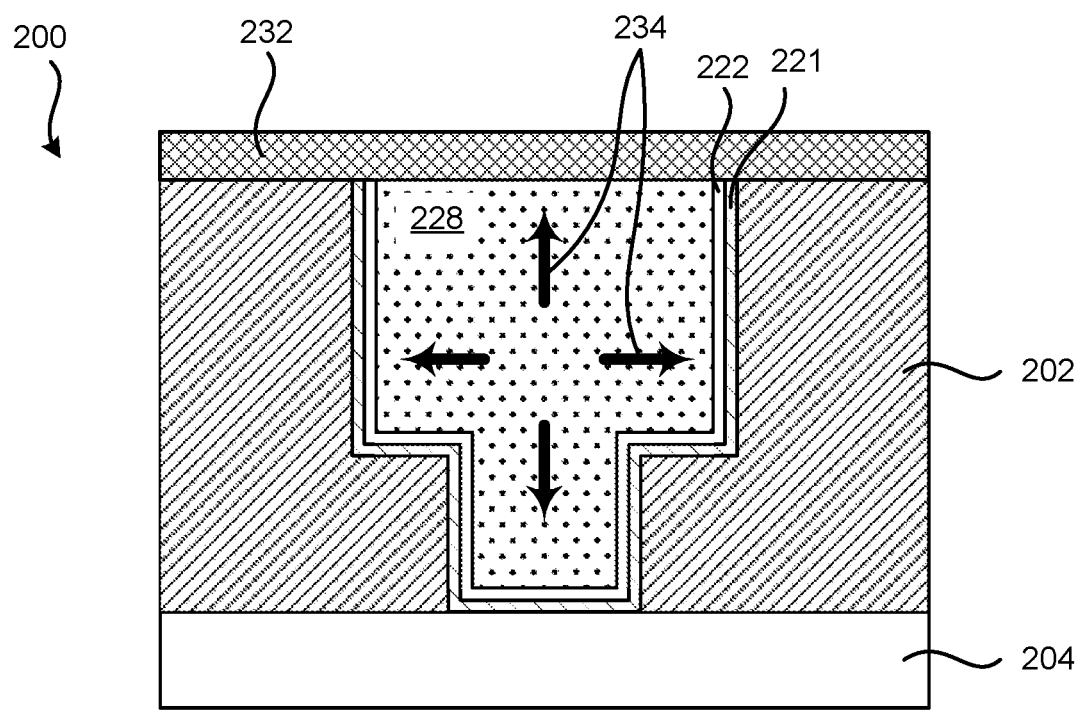

According to one embodiment, a Cu layer 230 may be electroplated on the CuMn metal 228 (FIG. 2F), the Cu layer 230 and the CuMn metal 228 planarized using chemical mechanical polishing (CMP), and a nitride cap layer 232 (e.g., SiN) deposited on the planarized substrate 200 (FIG. 2G).

The method further includes, in 20, heat-treating the substrate 200 to diffuse Mn from the CuMn metal 228 through the Ru metal liner 222 to the oxidized barrier layer 221. The Mn diffusion from the CuMn metal 228 to the oxidized barrier layer 221 and the nitride cap layer 232 is indicated by arrows 234 in FIG. 2H. The heat-treating may be carried out in a separate furnace, for example at a substrate temperature between about 350° C. and about 400° C.

Figure 2I:
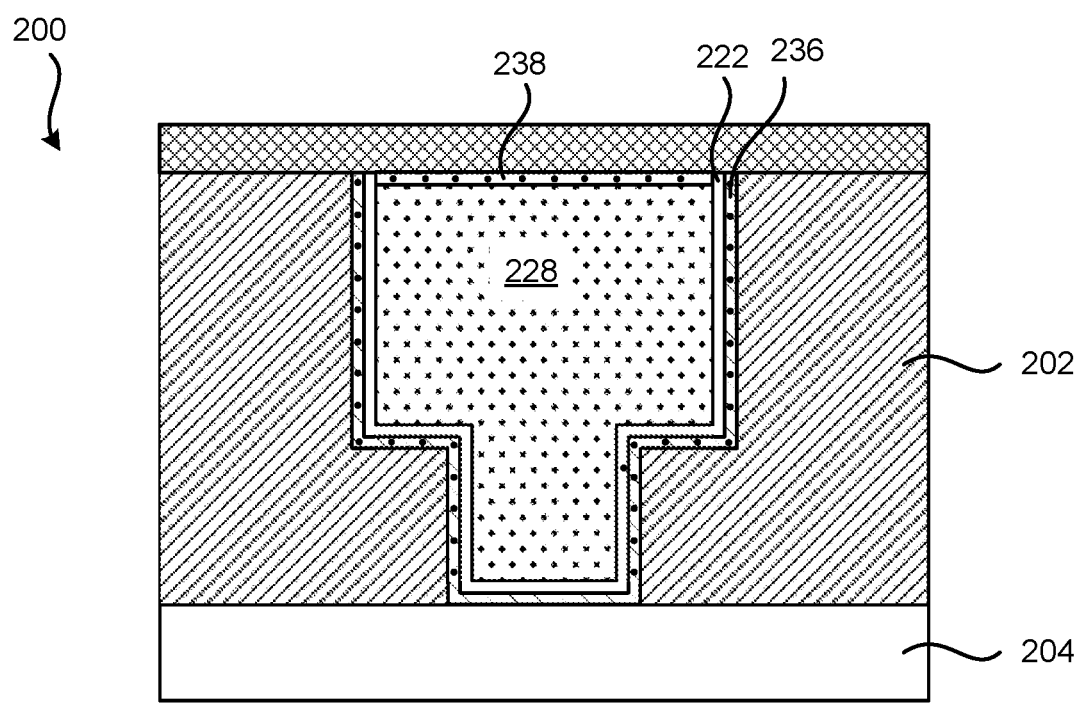

In 22, the diffused Mn reacts with the oxidized barrier layer 221 to form a Mn-containing diffusion barrier 236. Furthermore, the diffused Mn forms a barrier 238 in contact with the nitride cap layer 232 (FIG. 2I).

According to embodiments of the invention, the presence of oxygen in the oxidized barrier layer 221 enhances the Mn diffusion from the CuMn metal 228 to the oxidized barrier layer 221 due to the high affinity of Mn for oxygen. The diffused Mn reacts with the oxidized barrier layer 221 to form the Mn-containing diffusion barrier 236. In some examples, the Mn-containing diffusion barrier 236 contains TaNMnO or TaAlNMnO. Without formation of the oxidized barrier layer 221, experiments show that the Mn diffusion is mostly limited to formation of the barrier 238 in contact with the nitride cap layer 232.

Figure 3:
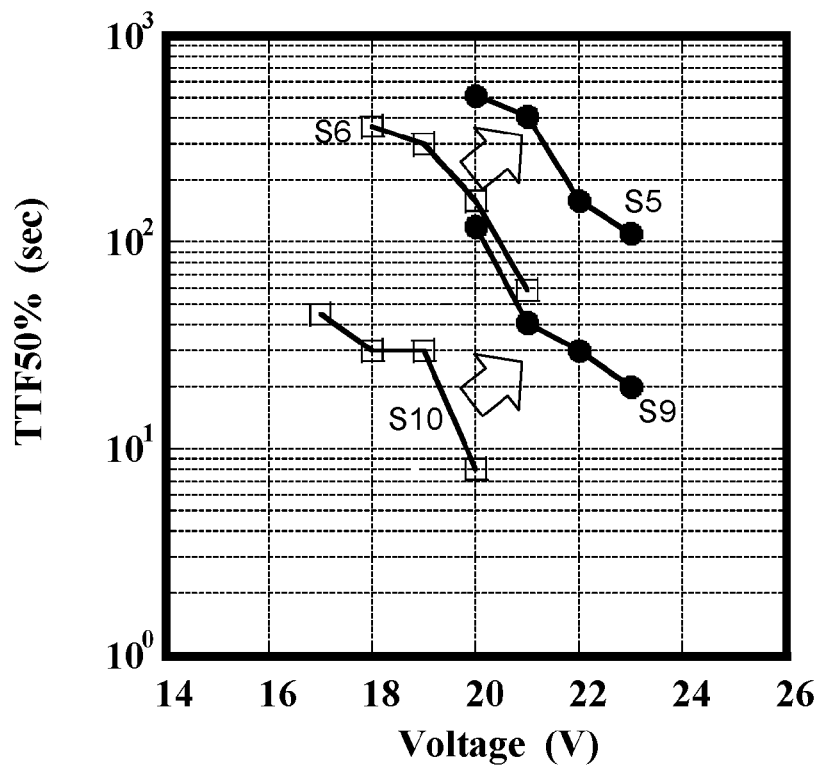
FIG. 3 shows time dependent dielectric breakdown (TDDB) for substrates processed according to embodiments of the invention.

FIG. 3 shows TDDB for substrates processed according to embodiments of the invention. The four samples included two samples with TaN barrier layers and two samples with TaAlN barrier layers, with or without air exposures after deposition of a Ru metal liner, and thereafter CuMn metal filling, and heat-treating. The different samples included: S5) ALD TaN 1 nm with air exposure, S6) ALD TaN 1 nm without air exposure, S9) ALD TaAlN 1 nm with air exposure, and S10) ALD TaAlN 1 nm without air exposure. The results show that the air exposure improved the TDDB for both TaN and TaAlN barrier layers. This is attributed to formation of TaNMnO and TaAlNMnO barrier layers with improved barrier properties compared to TaN and TaAlN barrier layers.

Figure 4:
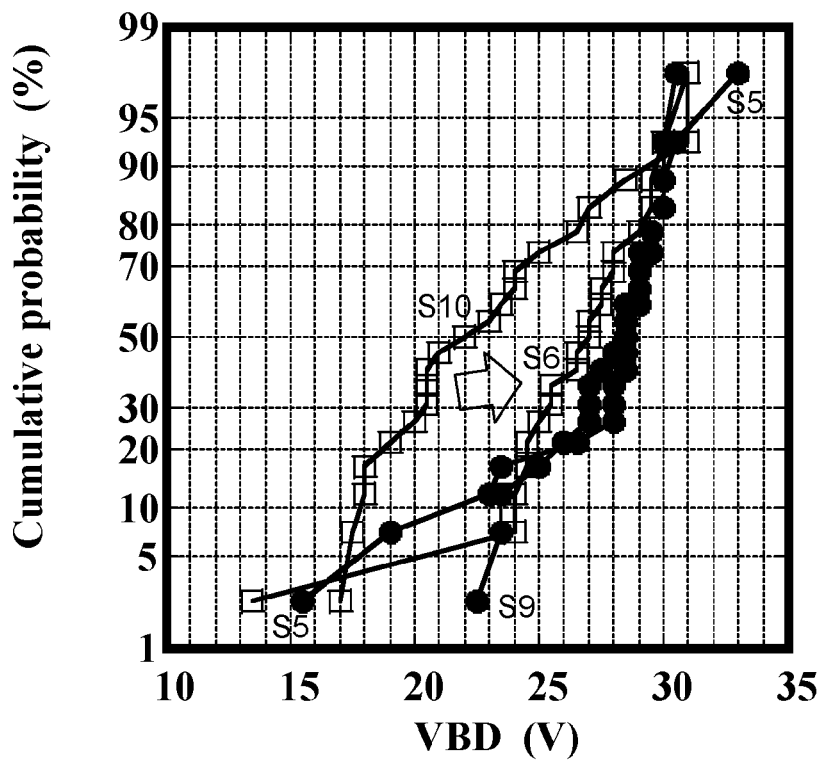
FIG. 4 shows time zero dielectric breakdown (TZDB) for substrates processed according to embodiments of the invention.

FIG. 4 shows TZDB for substrates processed according to embodiments of the invention. The four samples were described above in reference to FIG. 3. The results show that the air exposure improved the TZDB for both TaN and TaAlN barrier layers, as the breakdown voltage (VDB) of the 1 nm barrier layers was improved.

Figure 5:
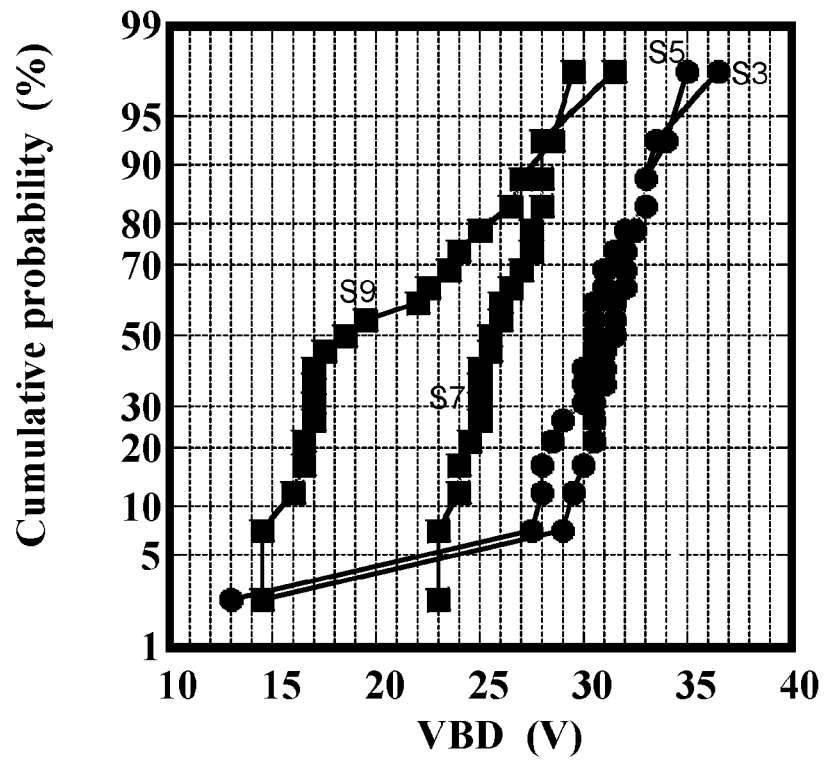
FIG. 5 shows TZDB for substrates processed according to embodiments of the invention.

FIG. 5 shows TZDB for substrates processed according to embodiments of the invention. The four samples included TaN and TaAlN barrier layers, without heat-treating following a CuMn metal filling: S3) ALD TaN 2 nm, S5) ALD TaAlN 2 nm; S7) ALD TaN 1 nm, and S9) ALD TaAlN 1 nm. The results show that the thicker (2 nm) TaN and TaAlN barrier layers provided improved TZDB. The four samples were not exposed to air prior to the CuMn filling.

Figure 6:
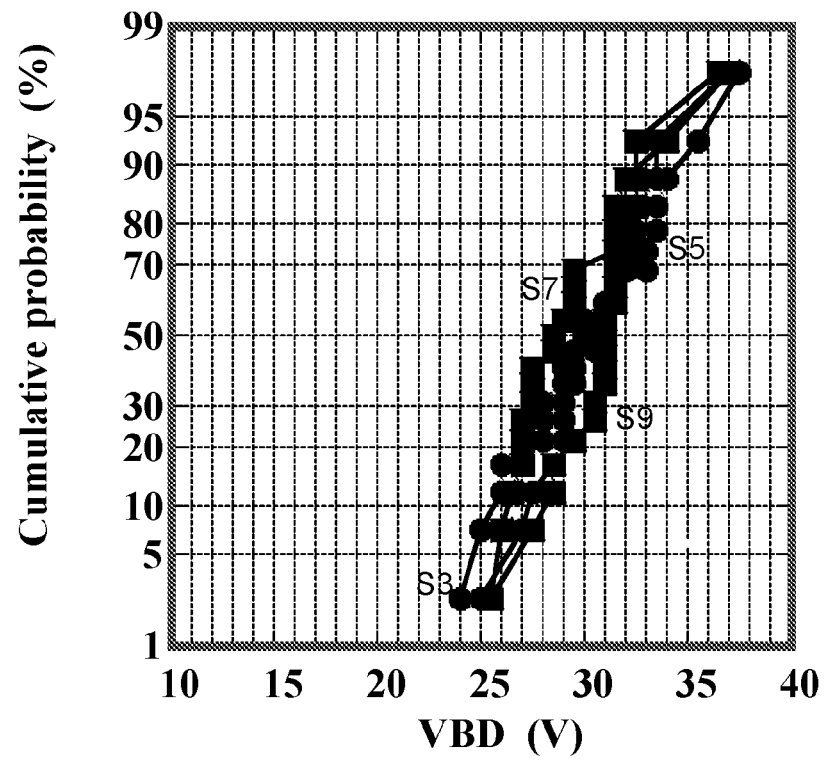
FIG. 6 shows TZDB for substrates processed according to embodiments of the invention.

FIG. 6 shows TZDB for substrates processed according to embodiments of the invention. The four samples were described above in reference to FIG. 5. The four samples were further heat-treated at a temperature of 400° C. for 40 min following a CuMn metal filling. The four samples were not exposed to air prior to the CuMn filling. The results show that 1 nm TaN and TaAlN barrier layers had comparable TZDB as the 2 nm TaN and TaAlN barrier layers following the heat-treating.

Figure 7:
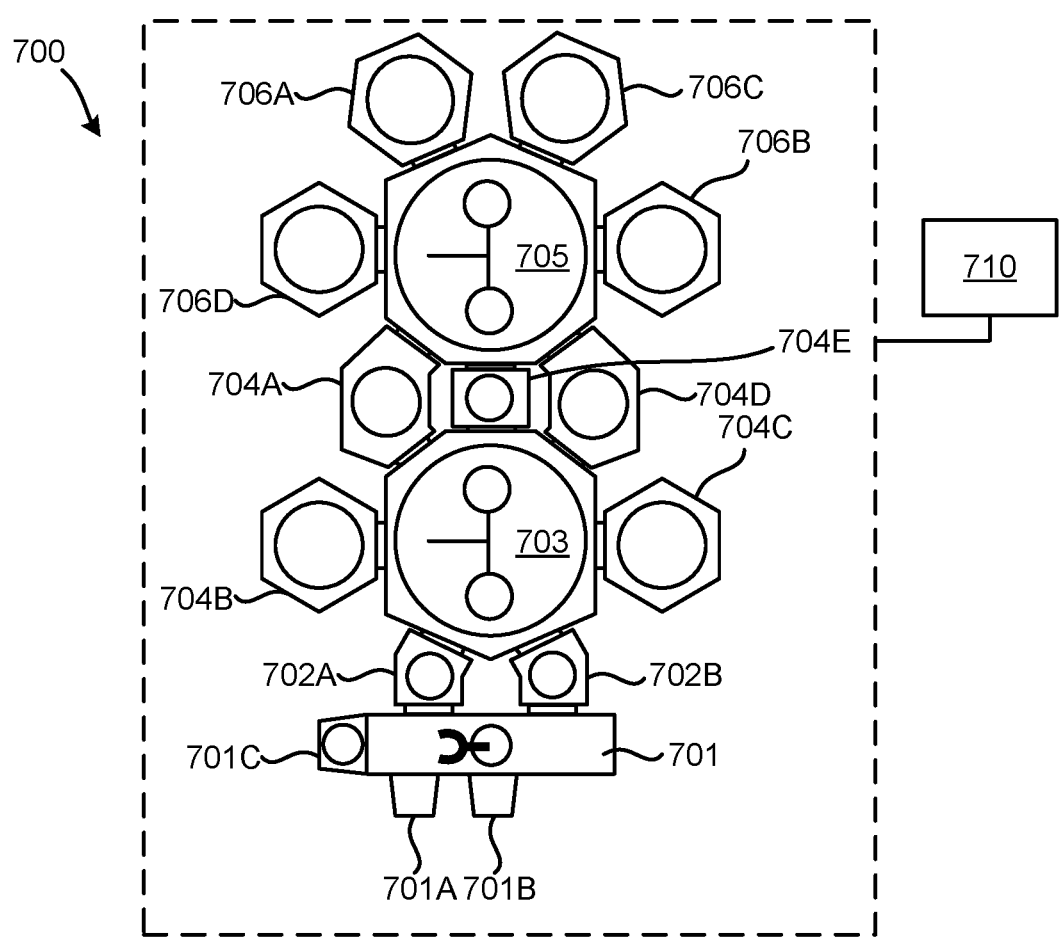
FIG. 7 is a schematic diagram of a high-vacuum cluster tool for performing integrated processing according to embodiments of the invention.

The integration of ALD barrier layer and CVD Ru metal liner for Cu filling of recessed features may be performed on a Trias-Tandem® cluster tool available from Tokyo Electron Limited (Akasaka, Japan). Such a cluster tool is schematically shown in FIG. 7. Substrate processing that does not include an intermediate air exposure may be performed in the cluster tool. The cluster tool can maintain high-vacuum during the substrate processing.

FIG. 7 is a schematic diagram of a high-vacuum cluster tool for performing integrated processing according to embodiments of the invention. The high-vacuum processing tool 700 contains a substrate (wafer) transfer system 701 that includes cassette modules 701A and 701B, and a substrate alignment module 701C. Load-lock chambers 702A and 702B are coupled to the substrate transfer system 701. The substrate transfer system 701 is maintained at atmospheric pressure but a clean environment is provided by purging with an inert gas.

The load-lock chambers 702A and 702B are coupled to a substrate transfer system 703. The substrate transfer system 703 may be maintained at a very low base pressure (e.g., $5 \times 10^{-8}$ Torr, or lower), using a turbomolecular pump (not shown). The substrate transfer system 703 includes a substrate transfer robot and is coupled to degassing/$H_2$ preclean systems 704A and 704D, and processing systems 704B and 704C. According to one embodiment, processing systems 704B and 704C may be configured for performing IPVD for CuMn filling of recessed features.

Furthermore, the substrate transfer system 703 is coupled to a substrate transfer system 705 through substrate handling chamber 704E. As in the substrate transfer system 703, the substrate transfer system 705 may be maintained at a very low base pressure (e.g., $5 \times 10^{-8}$ Torr, or lower), using a turbomolecular pump (not shown). The substrate transfer system 705 includes a substrate transfer robot. Coupled to the substrate transfer system 705 are processing systems 706A and 706C that may be configured for performing ALD of TaN and TaAlN barrier layers, and processing systems 706D and 706B configured for performing CVD Ru metal. According to one embodiment of the invention, the CVD Ru may utilize a deposition gas containing $Ru_3(CO)_{12}$ and CO for depositing Ru metal liners. An exemplary CVD Ru metal system and method of operating is described in detail in U.S. Pat. No. 7,270,848, the entire contents of which are herein incorporated by reference.

According to one embodiment, one or more of the processing systems 706D and 706B may be utilized for exposing a substrate to an oxidation source gas following deposition of a CVD Ru metal liner onto a barrier layer. The oxidation source gas can, for example, include oxygen ($O_2$), water ($H_2O$), and a combination thereof.

The high-vacuum processing tool 700 includes a controller 710 that can be coupled to and control any or all of the processing systems and processing elements depicted in FIG. 7 during the integrated substrate processing. Alternatively, or in addition, controller 710 can be coupled to one or more additional controllers/computers (not shown), and controller 710 can obtain setup and/or configuration information from an additional controller/computer. The controller 710 can be used to configure any or all of the processing systems and processing elements, and the controller 710 can collect, provide, process, store, and display data from any or all of the processing systems and processing elements. The controller 710 can comprise a number of applications for controlling any or all of the processing systems and processing elements. For example, controller 710 can include a graphic user interface (GUI) component (not shown) that can provide easy to use interfaces that enable a user to monitor and/or control one or more processing systems processing elements.

The controller 710 can include a microprocessor, memory, and a digital I/O port capable of generating control voltages sufficient to communicate, activate inputs, and exchange information with the high-vacuum processing tool 700 as well as monitor outputs from the high-vacuum processing tool 700. For example, a program stored in the memory may be utilized to activate the inputs of the high-vacuum processing tool 700 according to a process recipe in order to perform integrated substrate processing. The controller 710 may be implemented as a general purpose computer system that performs a portion or all of the microprocessor based processing steps of the invention in response to a processor executing one or more sequences of one or more instructions contained in a memory. Such instructions may be read into the controller memory from another computer readable medium, such as a hard disk or a removable media drive. One or more processors in a multi-processing arrangement may also be employed as the controller microprocessor to execute the sequences of instructions contained in main memory. In alternative embodiments, hard-wired circuitry may be used in place of or in combination with software instructions. Thus, embodiments are not limited to any specific combination of hardware circuitry and software.

The controller 710 includes at least one computer readable medium or memory, such as the controller memory, for holding instructions programmed according to the teachings of the invention and for containing data structures, tables, records, or other data that may be necessary to implement the present invention. Examples of computer readable media are compact discs, hard disks, floppy disks, tape, magneto-optical disks, PROMs (EPROM, EEPROM, flash EPROM), DRAM, SRAM, SDRAM, or any other magnetic medium, compact discs (e.g., CD-ROM), or any other optical medium, punch cards, paper tape, or other physical medium with patterns of holes, a carrier wave (described below), or any other medium from which a computer can read.

Stored on any one or on a combination of computer readable media, the present invention includes software for controlling the controller 710, for driving a device or devices for implementing the invention, and/or for enabling the controller 710 to interact with a human user. Such software may include, but is not limited to, device drivers, operating systems, development tools, and applications software. Such computer readable media further includes the computer program product of the present invention for performing all or a portion (if processing is distributed) of the processing performed in implementing the invention.

The computer code devices of the present invention may be any interpretable or executable code mechanism, including but not limited to scripts, interpretable programs, dynamic link libraries (DLLs), Java classes, and complete executable programs. Moreover, parts of the processing of the present invention may be distributed for better performance, reliability, and/or cost.

The term "computer readable medium" as used herein refers to any medium that participates in providing instructions to the processor of the controller 710 for execution. A computer readable medium may take many forms, including but not limited to, non-volatile media, volatile media, and transmission media. Non-volatile media includes, for example, optical, magnetic disks, and magneto-optical disks, such as the hard disk or the removable media drive. Volatile media includes dynamic memory, such as the main memory. Moreover, various forms of computer readable media may be involved in carrying out one or more sequences of one or more instructions to processor of controller for execution. For example, the instructions may initially be carried on a magnetic disk of a remote computer. The remote computer can load the instructions for implementing all or a portion of the present invention remotely into a dynamic memory and send the instructions over a network to the controller 710.

The controller 710 may be locally located relative to the high-vacuum processing tool 700, or it may be remotely located relative to the high-vacuum processing tool 700. For example, the controller 710 may exchange data with the high-vacuum processing tool 700 using at least one of a direct connection, an intranet, the Internet and a wireless connection. The controller 710 may be coupled to an intranet at, for example, a customer site (i.e., a device maker, etc.), or it may be coupled to an intranet at, for example, a vendor site (i.e., an equipment manufacturer). Additionally, for example, the controller 710 may be coupled to the Internet. Furthermore, another computer (i.e., controller, server, etc.) may access, for example, the controller 710 to exchange data via at least one of a direct connection, an intranet, and the Internet. As also would be appreciated by those skilled in the art, the controller 710 may exchange data with the high-vacuum processing tool 700 via a wireless connection.

According to another embodiment, the substrate processing may be performed in the low-vacuum processing tool 800 in FIG. 8 and, subsequently, further processed in the high-vacuum processing tool 900 in FIG. 9. In this embodiment, the processing tools 800 and 900 are capable of replacing the high-vacuum processing tool 700 in FIG. 7. In one example, a barrier layer and a Ru metal liner may be deposited on a substrate in the low-vacuum processing tool 800 and, thereafter, the substrate is exposed to air to form an oxidized barrier layer. Then the substrate is further processed in the high-vacuum processing tool 900 where the substrate may treated by degassing and exposure to a reducing atmosphere, followed by deposition of CuMn metal by IPVD. The use of two processing tools, a low-vacuum processing tool 800 and a high-vacuum processing tool 900, removes the requirement of using a single large expensive high-vacuum processing tool 700. This reduces the cost of processing a substrate according to embodiments of the invention. The requirement for high-vacuum is mainly due to the IPVD CuMn processing systems, which require very low background impurities.

Figure 8:
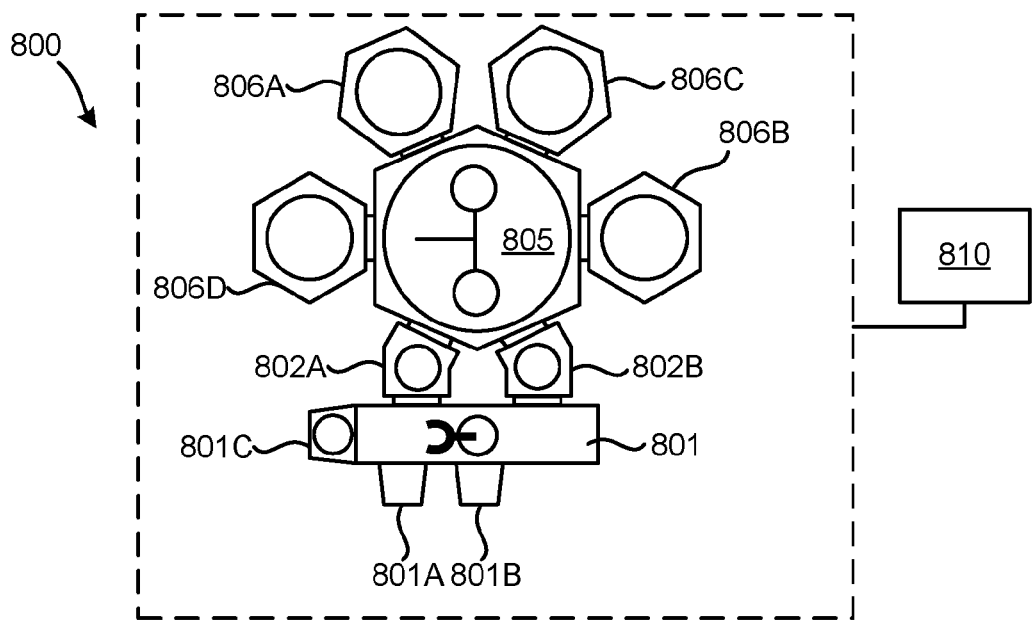
FIG. 8 is a schematic diagram of a low-vacuum cluster tool for performing integrated processing according to embodiments of the invention.

FIG. 8 is a schematic diagram of a low-vacuum cluster tool for performing integrated processing according to embodiments of the invention. The low-vacuum processing tool 800 contains a substrate (wafer) transfer system 801 that includes cassette modules 801A and 801B, and a substrate alignment module 801C. Load-lock chambers 802A and 802B are coupled to the substrate transfer system 801. The substrate transfer system 801 is maintained at atmospheric pressure but a clean environment is provided by purging with an inert gas.

The load-lock chambers 802A and 802B are coupled to a substrate transfer system 805. The substrate transfer system 805 may be maintained at a low base pressure (e.g., $1\times10^{-5}$ Torr, or lower), using a turbomolecular pump (not shown). The substrate transfer system 805 includes a substrate transfer robot and is coupled to processing systems 806A and 806C that may be configured for performing ALD of TaN and TaAlN barrier layers, and processing systems 806D and 806B configured for performing CVD Ru metal. The low-vacuum processing tool 800 includes a controller 810 that can be coupled to and control any or all of the processing systems and processing elements depicted in FIG. 8 during the integrated substrate processing.

Figure 9:
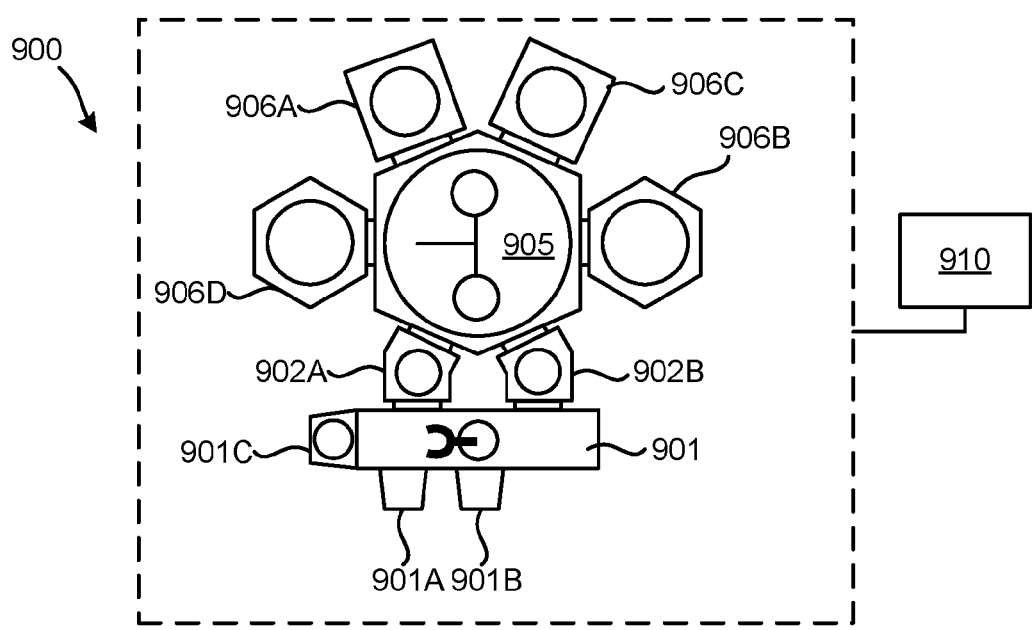
FIG. 9 is a schematic diagram of a high-vacuum cluster tool for performing integrated processing according to embodiments of the invention.

FIG. 9 is a schematic diagram of a vacuum cluster tool for performing integrated processing according to embodiments of the invention. The high-vacuum processing tool 900 contains a substrate (wafer) transfer system 901 that includes cassette modules 901A and 901B, and a substrate alignment module 901C. Load-lock chambers 902A and 902B are coupled to the substrate transfer system 901. The substrate transfer system 901 is maintained at atmospheric pressure but a clean environment is provided by purging with an inert gas.

The load-lock chambers 902A and 902B are coupled to a substrate transfer system 905. The substrate transfer system 903 may be maintained at a very low base pressure (e.g., $5\times10^{-8}$ Torr, or lower), using a turbomolecular pump (not shown). The substrate transfer system 905 includes a substrate transfer robot and is coupled to degassing/H$_2$ preclean systems 906A and 906C, and processing systems 906B and 906D configured for performing IPVD for CuMn filling of recessed features.

The high-vacuum processing tool 900 includes a controller 910 that can be coupled to and control any or all of the processing systems and processing elements depicted in FIG. 9 during the integrated substrate processing.

A plurality of embodiments for methods of integration of ALD barrier layer and CVD Ru metal liner for Cu metallization have been described. The methods provide a much needed solution for manufacturing semiconductor devices that require superior void-free Cu metal filling of narrow, high-aspect-ratio recessed features. The foregoing description of the embodiments of the invention has been presented for the purposes of illustration and description. It is not intended to be exhaustive or to limit the invention to the precise forms disclosed. This description and the claims following include terms that are used for descriptive purposes only and are not to be construed as limiting.

Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

What is claimed is:

1. A method for forming a semiconductor device, the method comprising
   providing a substrate containing a recessed feature;
   depositing a barrier layer in the recessed feature;
   depositing a Ru metal liner on the barrier layer, wherein the barrier layer contains TaN or TaAlN;
   exposing the substrate to an oxidation source gas to oxidize the barrier layer through the Ru metal liner;
   filling the recessed feature with CuMn metal using an ionized physical vapor deposition (IPVD) process;
   heat-treating the substrate to diffuse Mn from the CuMn metal to the oxidized barrier layer; and
   reacting the diffused Mn with the oxidized barrier layer to form a Mn-containing diffusion barrier.

2. The method of claim 1, further comprising
   after depositing the Ru metal liner and before filling the recessed feature, heat-treating the substrate in an inert atmosphere.

3. The method of claim 1, further comprising after depositing the Ru metal liner and before filling the recessed feature, exposing the substrate to plasma-excited $H_2$ gas.

4. The method of claim 1, further comprising
prior to the heat-treating, plating Cu metal on the CuMn metal;
removing excess plated Cu metal and CuMn metal by chemical mechanical polishing (CMP) from above the recessed feature; and
depositing a nitride cap layer.

5. The method of claim 1, wherein exposing the substrate to an oxidation source gas includes exposing the substrate to air.

6. The method of claim 1, wherein exposing the substrate to an oxidation source gas includes exposing the substrate to oxygen ($O_2$), water ($H_2O$), or a combination thereof.

7. The method of claim 1, wherein the Ru metal liner is deposited by chemical vapor deposition (CVD) using a $Ru_3(CO)_{12}$ precursor and CO as a carrier gas.

8. A method for forming a semiconductor device, the method comprising:
processing a substrate in a low-vacuum processing tool by providing a substrate containing a recessed feature;
depositing a barrier layer in the recessed feature, wherein the barrier layer contains TaN or TaAlN; and
depositing a Ru metal liner on the barrier layer;
removing the substrate from the low-vacuum processing tool;
exposing the substrate to an oxidation source gas to oxidize the barrier layer through the Ru metal liner; and
processing the substrate in a high-vacuum processing tool by filling the recessed feature with CuMn metal using an ionized physical vapor deposition (IPVD) process.

9. The method of claim 8, further comprising:
heat-treating the substrate to diffuse Mn from the CuMn metal to the oxidized barrier layer; and
reacting the diffused Mn with the oxidized barrier layer to form a Mn-containing diffusion barrier.

10. The method of claim 8, further comprising
after depositing the Ru metal liner and before filling the recessed feature, heat-treating the substrate in an inert atmosphere.

11. The method of claim 8, further comprising
after depositing the Ru metal liner and before filling the recessed feature, exposing the substrate to plasma-excited $H_2$.

12. The method of claim 9, further comprising
prior to the heat-treating, plating Cu metal on the CuMn metal;
removing excess plated Cu metal and CuMn metal from above the recessed feature; and
depositing a nitride cap layer.

13. The method of claim 8, wherein exposing the substrate to an oxidation source gas includes exposing the substrate to air.

14. The method of claim 8, wherein exposing the substrate to an oxidation source gas includes exposing the substrate to oxygen ($O_2$), water ($H_2O$), or a combination thereof.

15. The method of claim 8, wherein the Ru metal liner is deposited by chemical vapor deposition (CVD) using a $Ru_3(CO)_{12}$ precursor and CO as a carrier gas.

16. A method for forming a semiconductor device, the method comprising providing a substrate containing a recessed feature;
depositing a TaN or TaAlN barrier layer in the recessed feature;
depositing a Ru metal liner on the barrier layer, the Ru metal liner having a thickness between about 0.3 nm and about 2 nm;
exposing the substrate to an oxidation source gas containing oxygen ($O_2$), water ($H_2O$), or a combination thereof, to oxidize the barrier layer through the Ru metal liner;
filling the recessed feature with CuMn metal using an ionized physical vapor deposition (IPVD) process and a CuMn sputtering target with between about 1 and about 20 atomic % Mn;
heat-treating the substrate to diffuse Mn from the CuMn metal through the Ru metal liner to the oxidized barrier layer; and
reacting the diffused Mn with the oxidized barrier layer to form a Mn-containing diffusion barrier.

17. The method of claim 16, wherein the heat-treating is performed at a temperature between about 350° C. and about 400° C.

18. The method of claim 16, further comprising
after depositing the Ru metal liner and before filling the recessed feature, heat-treating the substrate in an inert atmosphere.

* * * * *